(12) United States Patent
Toyoshima et al.

(10) Patent No.: US 6,699,748 B2
(45) Date of Patent: Mar. 2, 2004

(54) METHOD OF FABRICATING CAPACITOR HAVING A PHOTOSENSITIVE RESIN LAYER AS A DIELECTRIC

(75) Inventors: Toshiyuki Toyoshima, Hyogo (JP); Hirofumi Fujioka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 45 days.

(21) Appl. No.: 10/303,781

(22) Filed: Nov. 26, 2002

(65) Prior Publication Data

US 2003/0224568 A1 Dec. 4, 2003

(30) Foreign Application Priority Data

May 30, 2002 (JP) ........................................ 2002-157585

(51) Int. Cl.⁷ .......................................... H01L 21/8242
(52) U.S. Cl. ....................... 438/240; 438/253; 438/250; 438/393; 438/396
(58) Field of Search ................... 438/239–240, 438/250–256, 393–399; 427/331, 340; 430/494

(56) References Cited

U.S. PATENT DOCUMENTS

| 5,863,679 A | 1/1999 | Tsushima et al. | |
| 6,329,264 B1 | * 12/2001 | Wu | 438/398 |
| 2003/0003765 A1 | * 1/2003 | Gibson et al. | 438/760 |

FOREIGN PATENT DOCUMENTS

| EP | 0 725 315 A2 | 8/1996 |
| JP | 64-80096 | 3/1989 |
| JP | 7-92695 | 4/1995 |
| JP | 8-262728 | 10/1996 |
| JP | 2000-338667 | 12/2000 |
| JP | 2001-15918 | 1/2001 |
| JP | 2001-15928 | 1/2001 |

OTHER PUBLICATIONS

Reardon, E., et al., "Novel Thin Film Materials and Process for Integral (Embedded) Resistors and Capacitors", Electronic Circuits World Convention 8, Tokyo, 1999, pp. T4–2–1 to T4–2–5.

* cited by examiner

Primary Examiner—John Niebling
Assistant Examiner—Jennifer M. Kennedy
(74) Attorney, Agent, or Firm—Leydig, Voit & Mayer, Ltd.

(57) ABSTRACT

A method of fabricating a capacitor includes selectively forming a positive photosensitive resin layer on a first conductive layer; exposing the positive photosensitive resin layer, immersing the exposed positive photosensitive resin layer in a solution in which dielectric particles are dispersed and diffusing the dielectric particles into the positive photosensitive resin layer; forming an insulating resin layer covering side faces of the positive photosensitive resin layer; and forming a second conductive layer on the positive photosensitive resin layer. According to the method, a very reliable capacitor having excellent electrical characteristics, such as dielectric strength, can be cheaply and easily fabricated in a wiring layer.

8 Claims, 7 Drawing Sheets

US 6,699,748 B2

1

METHOD OF FABRICATING CAPACITOR HAVING A PHOTOSENSITIVE RESIN LAYER AS A DIELECTRIC

BACKGROUND OF THE INVENTION

1. Field of the Invention

The present invention relates to a method of fabricating a capacitor, and more particularly to a method of fabricating a capacitor formed in a re-wiring layer of a semiconductor device or a wiring layer of a printed circuit board or the like.

2. Description of the Background Art

In recent years, a demand for miniaturization of electronic devices has been strong and, accordingly, the size of each of various electronic parts is being reduced. A capacitor is not an exception and a demand for miniaturization of capacitors is also strong.

Conventionally, a capacitor is formed in a re-wiring layer in a semiconductor device. On the other hand, a printed circuit board (PCB) is constructed by mounting a capacitor element on the surface of the board, so that its miniaturization is not sufficient. One of methods of realizing miniaturization of a capacitor is a method of providing a capacitor in a printed wiring board so as to be formed in a re-wiring layer of a semiconductor device.

One of capacitor fabricating methods in the case of forming a capacitor in a printed wiring board is a method of forming a dielectric layer by applying a paste resin containing dielectric particles by printing. Although the method is excellent with respect to the point that the dielectric layer can be formed easily, it also has a problem that it is difficult to form a dielectric layer having a high dielectric constant. The problem is caused by the fact that there is a natural limitation on the viscosity of a material applied by printing. Specifically, in the case of mixing a large amount of dielectric particles into a paste resin material to increase the dielectric constant, the viscosity of the material applied exceeds the limit viscosity of application by printing, and it becomes difficult to form an even dielectric layer. Usually, in the case of using printing to form a fine pattern about 100 $\mu$m square, the maximum amount of dielectric particles which can be contained in a resin paste from the viewpoint of viscosity is about 30 vol % to 40 vol % in volume percentages or 80% by weight in a mass ratio, so that it is difficult to form a dielectric layer having a sufficiently high dielectric constant.

As another example of the method of fabricating a capacitor in the case of providing the capacitor in a printed wiring board, there is a known method of forming a capacitor by, in a manner similar to the case of forming a capacitor in a re-wiring layer of a semiconductor device, depositing an oxide layer of high dielectric constant by CVD (Chemical Vapor Deposition) or the like. FIGS. 11 to 16 are process drawings showing an example of a method of fabricating a capacitor by using CVD. With reference to the drawings, the conventional method of fabricating a capacitor by using CVD will be described in detail later.

First, a first conductive layer 102 is prepared as shown in FIG. 1. As the first conductive layer, for example, copper foil or the like is used. On the whole principal surface of first conductive layer 102, an oxide layer 103 of high dielectric constant is deposited by CVD method. Subsequently, as shown in FIG. 12, a second conductive layer 107 is formed on oxide layer 103 of high dielectric constant. In such a manner, a sandwich structure of three layers of conductive layer/oxide layer of high dielectric constant/conductive layer is obtained.

After that, as shown in FIG. 13, a resist pattern 108 is formed in a predetermined area on second conductive layer 107, and etching is performed by using resist pattern 108 as a mask. By the operations, as shown in FIG. 14, a capacitor of a desired shape in a desired size is formed. Subsequently, as shown in FIG. 15, prepregs 109 are stacked so as to sandwich the capacitor and compression-bonded by hot press, thereby forming insulating layers 106 so as to surround the capacitor as shown in FIG. 16. The prepregs are sheet members obtained by impregnating glass cloth or the like with epoxy resin or the like.

By the processes, the capacitor can be formed in a printed wiring board and the method largely contributes to miniaturization of an electronic device. However, the fabricating method has the following problems.

First, since CVD method is used to form an oxide layer of high dielectric constant, an expensive CVD system has to be introduced. The CVD system is far more expensive than other fabricating systems used to form a printed wiring board. The introduction of the CVD system extremely increases the manufacturing cost of a printed wiring board.

Second, compression bonding by hot press is necessary to form an insulating layer by using prepregs and the formation positions of the insulating layers may be deviated due to flow of the resin in the prepregs or thermal expansion by heating. The positional deviation deteriorates the yield of products, and causes increase in manufacturing cost.

As a capacitor fabricating method which does not cause such problems, there is a capacitor fabricating method disclosed in Japanese Patent Laying-Open No. 7-92695. FIGS. 17 to 21 are process drawings showing an example of the capacitor fabricating method disclosed in the publication. With reference to the drawings, the capacitor fabricating method disclosed in the publication will be described in detail later.

First, as shown in FIG. 17, a substrate 201 is prepared and a first conductive layer 202 is formed in a predetermined area on substrate 201. Subsequently, as shown in FIG. 18, a positive photosensitive resin is applied on substrate 201 so as to cover first conductive layer 202, thereby forming a positive photosensitive resin layer 203a. As the positive photosensitive resin, polysilane resin is used. To apply the positive photosensitive resin, usually, the spin coat method or the like is used. The resin is applied on the whole surface of substrate 201.

As shown in FIG. 19, a mask 210 having a predetermined pattern is prepared and fixed so that only the positive photosensitive resin in the portion on first conductive layer 202 can be exposed, and positive photosensitive resin layer 203a is irradiated with ultraviolet rays. In such a manner, only the positive photosensitive resin on the predetermined area of first conductive layer 202 is exposed, and an exposed positive photosensitive resin layer 203b is produced.

Subsequently, as shown in FIG. 20, positive photosensitive resin layers 203a and 203b are immersed in a solution 204 in which dielectric particles 205 are dispersed. At this time, positive photosensitive resin layer 203a which is not exposed is hardly impregnated with dielectric particles 205, whereas exposed positive photosensitive resin layer 203b is impregnated with a large amount of dielectric particles 205. This phenomenon occurs for the reason that a molecular chain in the positive photosensitive resin layer is cut by exposure, and small gaps are created in the positive photosensitive resin layer. As a result, dielectric particles 205 are diffused only in exposed positive photosensitive resin layer 203b, so that only this portion functions as a dielectric layer, and the remaining positive photosensitive resin layer 203a functions as an insulating layer.

Subsequently, as shown in FIG. 21, a second conductive layer 207 is formed on positive photosensitive resin layer 203b in which dielectric particles 205 are diffused. By the above operations, a sandwich structure of three layers of first conductive layer 202/positive photosensitive resin layer 203b in which dielectric particles 205 are diffused/second conductive layer 207 is obtained, and a capacitor is fabricated. Simultaneously, an insulating layer is formed by positive photosensitive resin layer 203a which is not exposed.

By performing the above processes, the capacitor can be formed in a printed wiring board without using an expensive CVD system, and miniaturization of an electronic device can be realized at low cost. Since the dielectric layer and the insulating layer are formed by selectively exposing the positive photosensitive resin preliminarily applied on the whole surface of the substrate by spin coating or the like, there is no fear of the positional deviation which occurs in the case of using prepregs, so that the yield is largely improved. Further, the exposed positive photosensitive resin layer can be impregnated with a large amount of the dielectric particles, so that the dielectric layer of high dielectric constant can be formed.

The capacitor fabricating method using the positive photosensitive resin has, however, the following problems.

First, there is the possibility that the capacitor formed by the fabricating method has poor dielectric strength. The poor dielectric strength is caused by a large difference in the coefficient of thermal expansion between the positive photosensitive resin layer in the portion where the dielectric particles are diffused (hereinafter, referred to as a diffusion layer) and the positive photosensitive resin layer in the portion where the dielectric particles are not diffused (hereinafter, referred to as a non-diffusion layer). Usually, in the processes of fabricating a printed wiring board, due to a curing process, a process of mounting to a mother board, a change with time after shipment of a product, and the like, a large thermal shock is applied into the board. In the case where such a thermal shock is applied to the printed wiring board, a large stress concentration accompanying the difference in the coefficient of thermal expansion occurs in the boundary between the diffusion layer and the non-diffusion layer, and it is feared that a crack occurs. A crack largely deteriorates the dielectric strength characteristic of the capacitor, and a serious influence is exerted on the yield and reliability.

Second, the point that the positive photosensitive resin used to form the dielectric layer and the insulating layer is very expensive can be mentioned. Usually, a cheap resin material such as epoxy resin is used as the material of the insulating layer formed in the printed wiring board. In contrast, the positive photosensitive resin typified by the polysilane resin is very expensive. Consequently, when the above fabricating method is used, a problem such that the manufacturing cost largely increases occurs.

Third, since photolithography is used to form the dielectric layer of the capacitor, a problem that the fabricating process is complicated arises. In the photolithography process in the fabricating method, a mask for selectively exposing the positive photosensitive resin layer is necessary. Since the work such as fixing of the mask becomes necessary, the work becomes complicated, and the manufacturing cost accordingly increases.

SUMMARY OF THE INVENTION

An object of the present invention is to provide a capacitor fabricating method capable of cheaply and easily fabricating a very reliable capacitor having excellent electric characteristics such as high dielectric strength.

To achieve the object, a method of fabricating a capacitor according to the present invention includes the following steps:

(a) a step of selectively forming a positive photosensitive resin layer on a first conductive layer;

(b) a step of exposing the positive photosensitive resin layer;

(c) a step of immersing the positive photosensitive resin layer in a solution in which dielectric particles are dispersed to diffuse the dielectric particles into the positive photosensitive resin layer;

(d) a step of forming an insulating resin layer so as to cover side faces of the positive photosensitive resin layer; and (e) a step of forming a second conductive layer on the positive photosensitive resin layer.

As described above, in the fabricating method, the positive photosensitive resin is used for the dielectric layer and the insulating resin is used for the insulating layer, so that stress in the interface of the layers can be reduced. Specifically, by forming the dielectric layer and the insulating layer by using different materials, as compared with the case of making the layers of the same material, stress which causes when thermal shock is applied is reduced, and generation of cracks is prevented Since the use amount of the positive photosensitive resin material is also largely reduced, the manufacturing cost can be reduced. Further, in the fabricating method, a process using a CVD system to form a dielectric layer and a process of selectively exposing the dielectric layer are unnecessary. Thus, the manufacturing process can be further simplified and the manufacturing cost can be further reduced.

In the method of fabricating a capacitor according to the present invention, preferably, for example, the positive photosensitive resin layer is formed by applying a positive photosensitive resin by printing method.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described later with reference to the drawings. The following capacitor fabricating method can be applied in the case of forming a capacitor in a re-wiring layer of a semiconductor device or a wiring layer in a printed wiring board or the like.

First Embodiment

Figure 1:
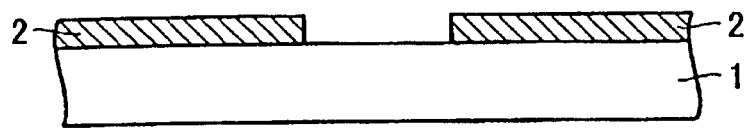
FIGS. 1 to 7 are process drawings showing a method of fabricating a capacitor according to a first embodiment of the present invention.

First, as shown in FIG. 1, a substrate 1 is prepared, and a first conductive layer 2 is formed in a predetermined area on substrate 1. As substrate 1, various things such as a substrate material typified by, for example, a glass-epoxy substrate or a silicon substrate and an insulating layer made of epoxy resin or a silicon oxide film can be employed. First conductive layer 2 can be made of, for example, copper, silver, gold, indium-tin-oxide, or the like can be used. As a method of forming first conductive layer 2, various methods such as sputtering, metal plating, CVD method, and printing method can be applied.

Figure 2:
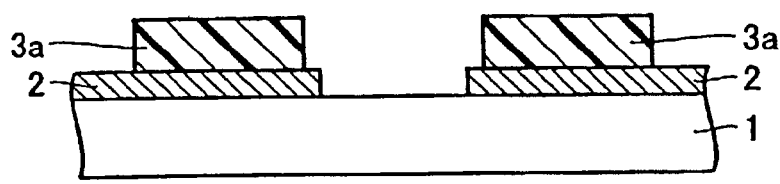

Subsequently, as shown in FIG. 2, a positive photosensitive resin is selectively applied on first conductive layer 2 by printing method, thereby forming a positive photosensitive resin layer 3a on first conductive layer 2. As the positive photosensitive resin, a resin using, as a main material, polysilane resin, silicon ladder resin, polysilazane resin, polyimide resin, epoxy resin, acrylic resin, phenol resin, fluorene resin, benzocyclobutene resin, phenol-novolak-based resin, or the like can be used. As application by printing, screen printing using a plate, ink jet printing, or the like can be applied. In the case of forming a plurality of capacitors as shown in the drawing, positive photosensitive resin layer 3a is formed on each of a plurality of first conductive layers 2 positioned apart from each other.

Figure 3:
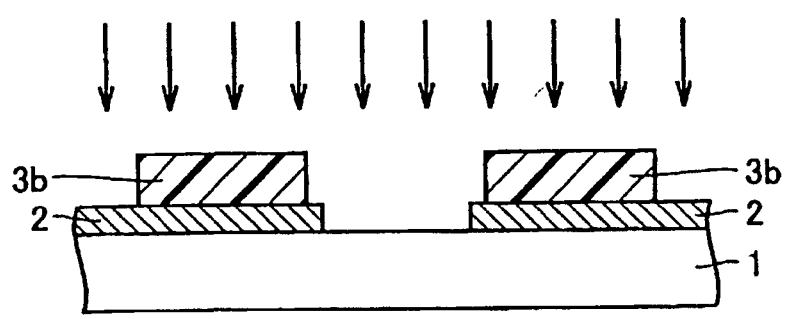

As shown in FIG. 3, positive photosensitive resin layer 3a formed on first conductive layer 2 is irradiated and exposed with ultraviolet rays. In this exposure process, it is unnecessary to selectively expose positive photosensitive resin layer 3a by using a mask but it is sufficient to irradiate the whole surface of substrate 1 with ultraviolet rays by using a high pressure mercury lamp or the like. In such a manner, positive photosensitive resin layer 3a is exposed and becomes an exposed positive photosensitive resin layer 3b.

Figure 4:
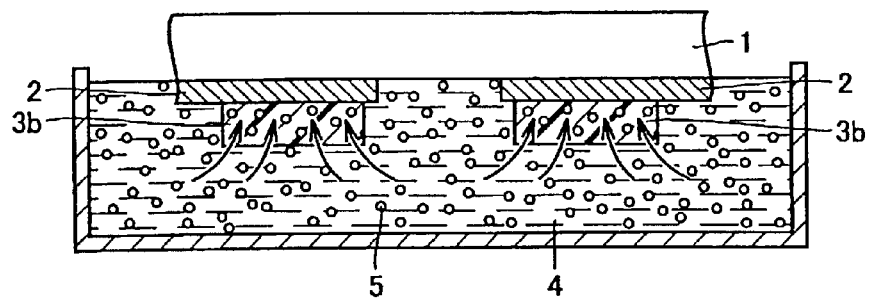

Subsequently, as shown in FIG. 4, exposed positive photosensitive resin layer 3b is immersed in a solution 4 in which dielectric particles 5 are dispersed. It is preferable to use, as dielectric particles 5, dielectric particles having a dielectric constant of 5 or higher. Suitable oxide particles are strontium titanate, barium titanate, lead zirconate titanate, calcium zirconate, lead titanate, titanium dioxide, silicon nitride, calcium stannate, bismuth titanate, barium strontium titanate, alumina, tantalum oxide, zirconium dioxide, lead oxide, lead zirconate titanate containing lantern, ruthenium dioxide, or the like. The concentration of dielectric particles 5 dispersed in solution 4 is adjusted to an optimum value in accordance with the kind of dielectric particles used, a flocculation state, the kind of a solution in which dielectric particles are dispersed, the kind of a positive photosensitive resin in which dielectric particles are diffused, and the like. The particle diameter of dielectric particle 5 is not particularly regulated as long as dielectric particles 5 are diffused in exposed positive photosensitive resin layer 3b but is preferably 200 nm or less, more preferably, 100 nm or less. It is therefore desirable to use dielectric particles of which average particle diameter is adjusted at least to 200 nm or less.

Solution 4 in which dielectric particles 5 are dispersed is properly selected in accordance with the positive photosensitive resin impregnated and the dielectric particles dispersed. For example, water, alkaline solution, organic solvent, or the like can be used. A dispersant may be properly added so that dielectric particles 5 are not flocculated in solution 4. Further, immersing time is not particularly regulated and it is sufficient to immerse positive photosensitive resin layer 3b so that dielectric particles 5 are diffused in exposed positive photosensitive resin layer 3b. The temperature of solution 4 or the like may be set to optimum temperature in accordance with a material used.

Subsequently, by performing washing and heating process as necessary, positive photosensitive resin layer 3b in which dielectric particles 5 are diffused comes to function as a dielectric layer having high dielectric constant.

Figure 5:
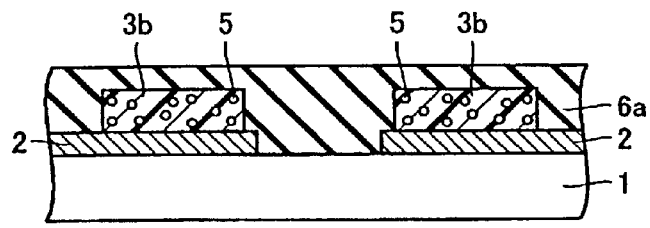

Further, as shown in FIG. 5, a non-photosensitive resin is applied on the whole surface of substrate 1 so as to cover positive photosensitive resin layer 3b in which dielectric particles 5 are diffused, thereby forming a non-photosensitive resin layer 6a. In the case of forming a plurality of capacitors as shown in the drawing, non-photosensitive resin layer 6a is formed so as to bury gaps between positive photosensitive resin layers 3a formed on the plurality of first conductive layers 2 positioned apart from each other. As the non-photosensitive resin, for example, polyimide resin, epoxy resin, benzocyclobutene resin, phenol resin, silicon ladder resin, acrylic resin, polyamide-imide resin, melamine resin, bismaleimide resin, polyester resin, urea resin, or the like is used. As a coating method, various coating methods such as spin coating and coating using a printing method can be used.

Figure 6:
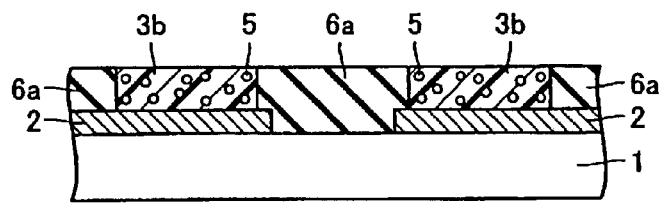
Figure 7:
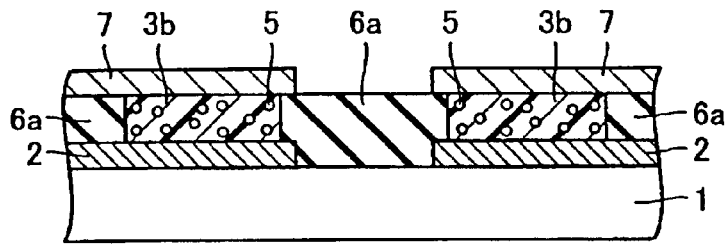

As shown in FIG. 6, non-photosensitive resin layer 6a is polished until the top face of positive photosensitive resin layer 3b in which dielectric particles 5 are diffused is exposed. Further, as shown in FIG. 7, a second conductive layer 7 is formed so as to cover the exposed surface of positive photosensitive resin layer 3b in which dielectric particles 5 are diffused. The second conductive layer may be made of, in a manner similar to the first conductive layer, for example, copper or silver. As a method of forming the second conductive layer, various methods such as sputtering, metal plating, and printing can be employed.

By the operations, a capacitor constructed by three layers of first conductive layer 2/positive photosensitive resin layer 3b in which dielectric particles 5 are diffused/second conductive layer 7 is fabricated in a predetermined size and in a predetermined shape in a wiring layer. Simultaneously, the side faces of positive photosensitive resin layer 3b in which dielectric particles 5 are diffused as a dielectric layer are covered with an insulating layer which is formed by non-photosensitive resin layer 6a as a member different from positive photosensitive resin layer 3b in which dielectric particles 5 are diffused. That is, in the case of providing a plurality of capacitors, spaces between the capacitors are buried with the insulating layer which is non-photosensitive resin layer 6a, thereby maintaining insulation between neighboring capacitors.

In the fabricating method, the layer functioning as a dielectric layer and the layer functioning as an insulating layer are made of different materials. Consequently, as compared with the case of making the layers of the same material, stress which occurs when thermal shock is applied is reduced, and occurrence of cracks is prevented. Since the use amount of the positive photosensitive resin material is also largely reduced, the manufacturing cost can be reduced.

Further, in the manufacturing method, the positive photosensitive resin for forming the dielectric layer can be applied by the printing method, so that work is not complicated and increase in the manufacturing cost can be prevented. In the manufacturing method, a process using a CVD system to form a dielectric layer and a process of selectively exposing the dielectric layer are unnecessary. Thus, the manufacturing process can be further simplified and the manufacturing cost can be further reduced.

EXAMPLE 1

Example 1 based on the first embodiment will be described later.

First, as substrate 1 shown in FIG. 1, a silicon substrate was prepared. On the silicon substrate, a copper sputter layer as second conductive layer 2 was formed by sputtering so that its thickness becomes 10 $\mu$m. Subsequently, positive photosensitive resin layer 3 shown in FIG. 2 was formed by using polysilane resin. The polysilane resin was formed by a screen printing machine so that the size becomes 10 mm in width and 10 mm in depth, and the thickness becomes 1 $\mu$m after baking. As baking parameters, baking temperature was set to 85° C. and baking time was set to 120 seconds.

Subsequently, the exposing process shown in FIG. 3 was performed by using an extra-high pressure mercury lamp (manufactured by Ushio Inc.). In the exposing process, the polysilane layer was exposed by irradiating the whole principle surface of the silicon substrate with ultraviolet rays of 3 J/cm$^2$, thereby obtaining exposed positive photosensitive resin layer 3b.

Solution 4 containing dielectric particles 5 shown in FIG. 4 was prepared. As solution 4, a tetramethyl ammonium hydrate solution of 3% by weight was used. As dielectric particles 5, barium titanate particles (manufactured by TPL Co.) having an average particle diameter of 50 nm were used. The solution was adjusted so that barium titanate particles contained in the tetramethyl ammonium hydrate solution become 5% by weight. In the tetramethyl ammonium hydrate solution, the polysilane layer serving as positive photosensitive resin layer 3b exposed in the exposing process was immersed for 15 minutes. After immersing, the polysilane layer was washed with pure water and dried. After drying, the polysilane layer was heated at 150° C. for one hour by using a hot plate and, further, heated at 300° C. under a nitrogen air current by using a circulating oven.

As shown in FIG. 5, the silicon substrate was coated with a nonphotosensitive polyimide resin (manufactured by Toray Industries) by spin coating so that the polysilane layer in which the barium titanate particles are diffused is covered. The resultant was heated at 80° C. for 30 minutes by using a hot plate and, further, heated at 300° C. under a nitrogen air current by using a circulating oven for two hours, thereby forming insulating resin layer 6a so that the thickness becomes 10 $\mu$m.

Subsequently, as shown in FIG. 6, the polyimide layer was polished until the top face of the polysilane layer was exposed. After that, a copper sputter layer of 1000 Å was formed by sputtering so as to cover the exposed surface of the polysilane layer in which barium titanate particles are diffused and the polyimide layer. Further, by performing electric field plating, the thickness of the copper sputter layer was increased, thereby obtaining second conductive 7 having a thickness of 10 $\mu$m as shown in FIG. 7. After that, by photolithography and wet etching, second conductive layer 7 was patterned.

By the above processes, a printed wiring board having a wiring layer in which a capacitor of a structure including the polysilicon layer in which barium titanate particles are diffused as a dielectric layer and the polysilane is sandwiched by conductive layers was manufactured. When the capacity of the capacitor was measured by using an LCR meter (manufactured by Yokogawa-Hewlett-Packard, Ltd), it was 64.5 pF, and the dielectric constant was 8.2. The values are excellent as those of a built-in capacitor of such a size.

Second Embodiment

Processes of a capacitor manufacturing method of a second embodiment up to the process of diffusing the dielectric particles into the positive photosensitive resin layer are similar to those of the first embodiment, so that their description will not be repeated.

Figure 8:
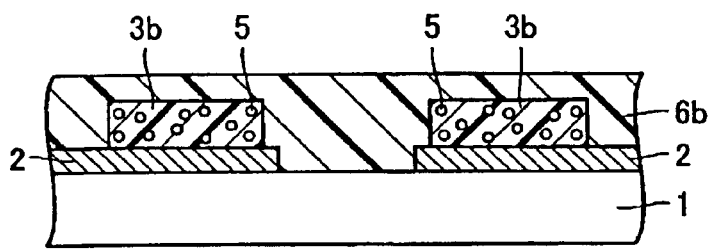
FIGS. 8 to 10 are process drawings showing a method of fabricating a capacitor according to a second embodiment of the present invention.

In the capacitor manufacturing method of the second embodiment, after performing the processes shown in FIGS. 1 to 4, as shown in FIG. 8, the whole surface of substrate 1 is coated with a negative photosensitive resin so as to cover positive photosensitive resin layer 3b in which dielectric particles 5 are diffused. As the negative photosensitive resin, for example, a resin containing, as a main material, epoxy resin, polyimide resin, benzocyclobutene resin, acrylic resin, phenol novolak resin, phenol resin, bismaleimide resin, melamine resin, urea resin, or the like is used. As a coating method, various coating methods such as spin coating and coating using a printing method can be used.

Figure 9:
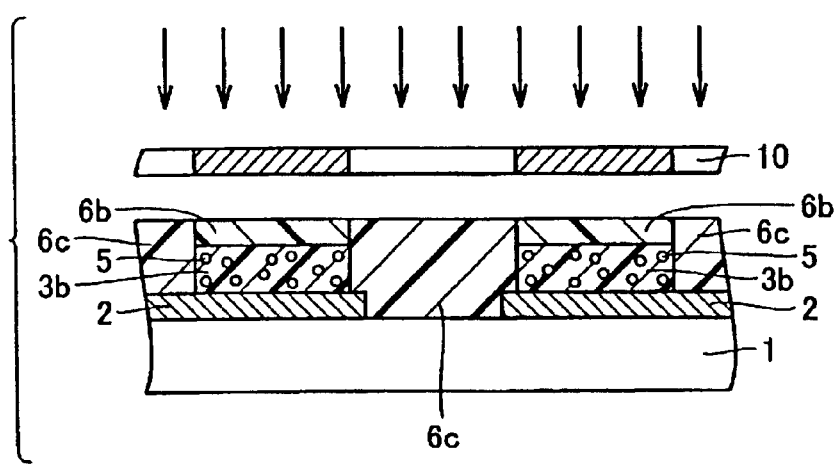

As shown in FIG. 9, a mask 10 having a predetermined pattern is prepared and negative photosensitive resin layer 6b is exposed so that only the negative photosensitive resin layer positioned on sides of positive photosensitive resin layer 3b in which dielectric particles 5 are diffused is selectively exposed by mask 10. By the operation, an exposed negative photosensitive resin layer 6c is formed so as to cover the side faces of positive photosensitive resin layer 3b in which dielectric particles 5 are diffused. After that, development is performed, and negative photosensitive resin layer 6b which is positioned on positive photosensitive resin layer 3b in which dielectric particles 5 are diffused and is not exposed is removed.

Figure 10:
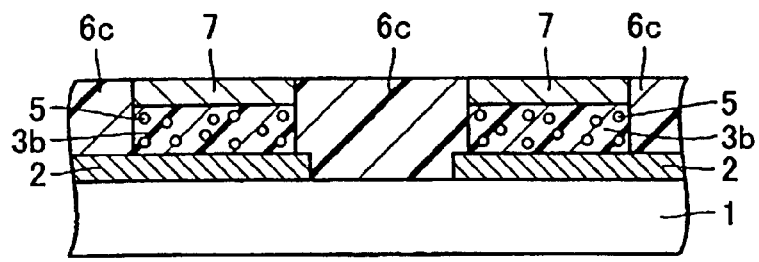
Figure 11:
FIGS. 11 to 16 are process drawings showing a conventional capacitor fabricating method.
Figure 12:
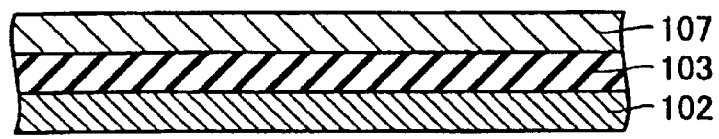
Figure 13:
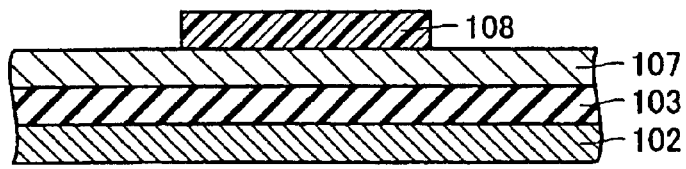
Figure 14:
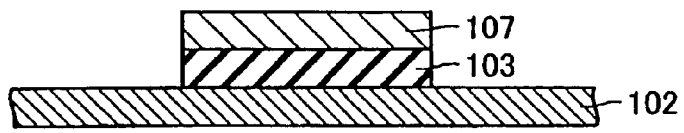
Figure 15:
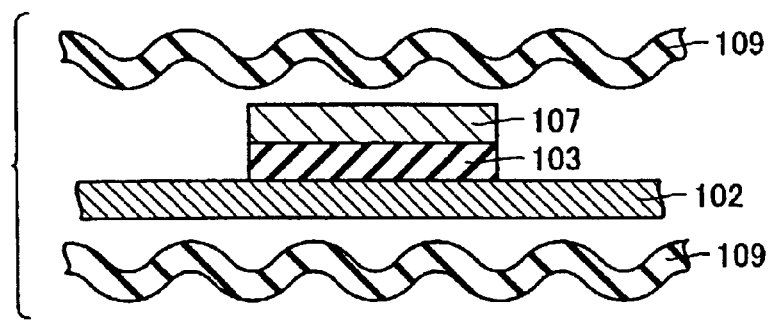
Figure 16:
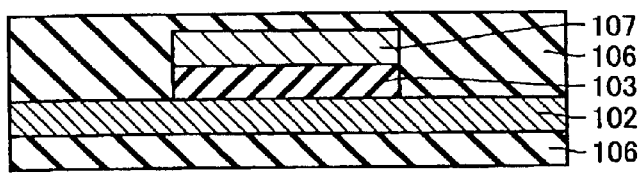
Figure 17:
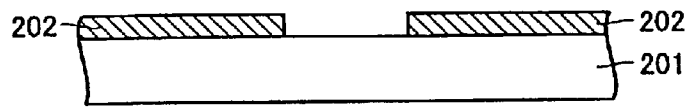
FIGS. 17 to 21 are process drawings showing another conventional capacitor fabricating method.
Figure 18:
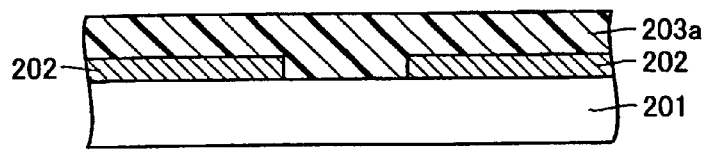
Figure 19:
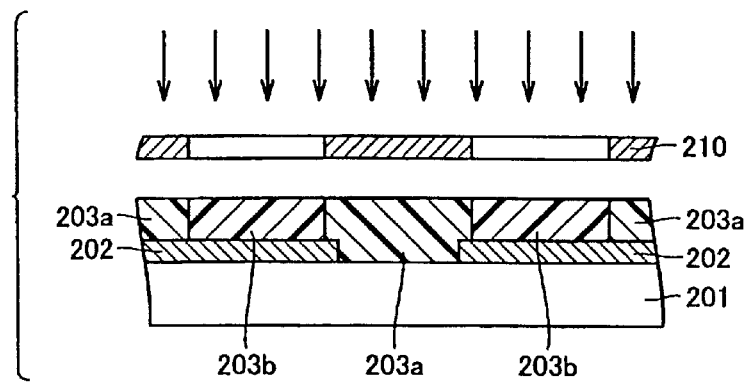
Figure 20:
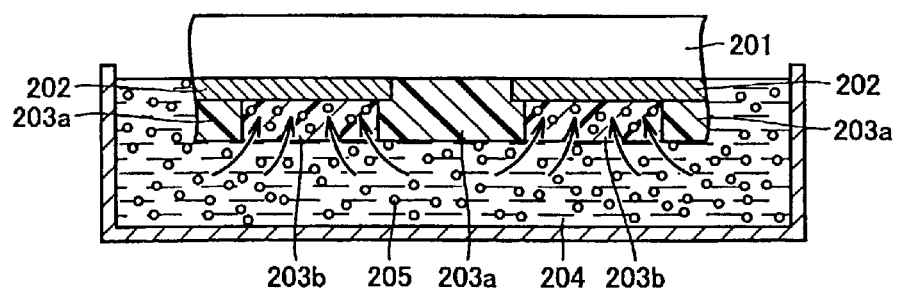
Figure 21:
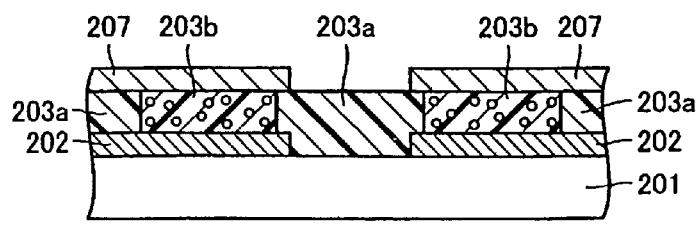

After that, as shown in FIG. 10, second conductive layer 7 is formed on positive photosensitive resin layer 3b in which dielectric particles 5 are diffused. As the conductive layer, in a manner similar to the first conductive layer, for example, copper, silver, or the like can be employed. As a method of forming the conductive layer, various methods such as sputtering, metal plating, and printing can be applied.

By the above operations, a capacitor having three layers of first conductive layer 2/positive photosensitive resin layer 3b in which dielectric particles 5 are diffused/second conductive layer 7 is fabricated in a wiring layer so as to have a predetermined size and a predetermined form. Simultaneously, the side faces of positive photosensitive resin layer 3b in which dielectric particles 5 are diffused and which functions as a dielectric layer are covered with the insulating layer taking the form of negative photosensitive resin layer 6c as a member different from positive photosensitive resin layer 3b in which dielectric particles 5 are diffused.

By fabricating a capacitor by using the fabricating method, effects similar to those of the foregoing first embodiment can be obtained. Further, in the second embodiment, the insulating resin layer covering the side faces of the positive photosensitive resin layer in which dielectric particles are diffused is formed by using the negative photosensitive resin. Consequently, a polishing process as in the first embodiment is unnecessary, and there is no fear of a mechanical damage.

EXAMPLE 2

Example 2 based on the second embodiment will be described later.

In Example 2, the processes of FIGS. 1 to 4 are substantially the same as those of Example 1 except that barium titanate particles having an average particle diameter of 100 nm (manufactured by Sakai Kogyo Co.) were used. The mass ratio of the barium titanate particles dispersed in the tetramethyl ammonium hydrate solution and the like are similar to those of Example 1. A process of curing a polysilane layer in which the barium titanate particles are diffused and which has been immersed, washed, and dried was performed by heating the polysilane layer at 150° C. for one hour, and further, heating the polysilane layer at 180° C. for one hour.

Subsequently, as shown in FIG. 8, a silicon substrate was spin-coated with a negative photosensitive epoxy resin (manufactured by Shipley company L.L.C.) so as to cover the polysilane layer in which the barium titanate particles are diffused, heated at 80° C. for 30 minutes by using a hot plate, and further heated at 85° C. for 15 minutes, thereby forming negative photosensitive resin layer 6b having a thickness of 10 μm.

As shown in FIG. 9, mask 10 having a predetermined pattern was prepared and the negative photosensitive epoxy resin layer was exposed In the exposing process, only the negative photosensitive epoxy resin layer in the portion to be left as an insulating resin layer was exposed. After that, a developing process was performed to selectively remove the negative photosensitive epoxy resin layer in the portion positioned on the polysilane layer. Further, after that, exposing process was performed again with ultraviolet rays of 3 J/cm² by using an extra-high pressure mercury lamp and heating process was performed at 150° C. for one hour by using a hot plate.

Subsequently, a copper sputter layer of 1000 Å was formed by sputtering so as to cover the exposed surface of the polysilane layer in which barium titanate particles are diffused and the negative photosensitive epoxy resin layer. Further, by performing electric field plating, the thickness of the copper sputter layer was increased, thereby obtaining second conductive 7 having a thickness of 10 μm as shown in FIG. 10. After that, by photolithography and wet etching, second conductive layer 7 was patterned.

By the above processes, a printed wiring board having a wiring layer in which the capacitor is formed was manufactured The capacitor has a structure including the polysilicon layer in which barium titanate particles are diffused as a dielectric layer. The polysilane is sandwiched by conductive layers. When the capacity of the capacitor was measured by using an LCR meter (manufactured by Yokogawa-Hewlett-Packard, Ltd), it was 39.8 pF, and the dielectric constant was 5.5. The values are excellent as those of a built-in capacitor of such a size.

In the first and second embodiments, the case of excessively applying a non-photosensitive resin and polishing the resin and the case of excessively applying a negative photosensitive resin and removing the excessive part by exposure and development to form the insulating resin layer have been described, but the present invention is not limited to the methods. For example, in the case of forming an insulating resin layer by printing, an insulating resin layer having a predetermined thickness can be formed without excessively applying an insulating resin.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a capacitor, comprising:

selectively forming a positive photosensitive resin layer on a first conductive layer;

exposing said positive photosensitive resin layer;

immersing said positive photosensitive resin layer, after exposure, in a solution in which dielectric particles are dispersed and diffusing said dielectric particles into said positive photosensitive resin layer;

forming an insulating resin layer covering side faces of said positive photosensitive resin layer; and forming a second conductive layer on said positive photosensitive resin layer.

2. The method of fabricating a capacitor according to claim 1, wherein said first conductive layer includes a plurality of portions spaced from each other, and including forming said positive photosensitive resin layer on each of the portions of the first conductive layer, spaced from each other, and filling gaps between the positive photosensitive layers on each of the portions of the first conductive layer, which are spaced from each other with said insulating resin layer.

3. The method of fabricating a capacitor according to claim 1, including applying said positive photosensitive resin layer by printing.

4. The method of fabricating a capacitor according to claim 1, wherein said positive photosensitive resin contains a resin selected from the group consisting of an olysilane resin, a silicon ladder resin, a polysilazane resin, a polyimide resin, an epoxy resin, an acrylic resin, a phenol resin, a fluorene resin, a benzocyclobutene resin, and a phenol novolak-based resin.

5. The method of fabricating a capacitor according to claim 1, wherein the dielectric constant of said dielectric particles is at least 5.

6. The method of fabricating a capacitor according to claim 1, wherein said dielectric particles have an average particle size not exceeding 200 nm.

7. The method of fabricating a capacitor according to claim 1, wherein said dielectric particles are oxide particles selected from the group consisting of strontium titanate, barium titanate, lead zirconate titanate, calcium zirconate, lead titanate, titanium dioxide, silicon nitride, calcium stannate, bismuth titanate, barium strontium titanate, alumina, tantalum oxide, zirconium dioxide, lead oxide, lead zirconate titanate, and ruthenium dioxide.

8. The method of fabricating a capacitor according to claim 1, wherein said insulating resin is one of a non-photosensitive resin and a negative photosensitive resin, and contains a resin selected from the group consisting of a polyimide resin, an epoxy resin, a benzocyclobutene resin, a phenol resin, a silicon ladder resin, an acrylic resin, a polyamideimide resin, a melamine resin, a bismaleimide resin, an polyester resin, and a urea resin.

* * * * *